(12) United States Patent
Mouttet

(10) Patent No.: US 7,609,086 B2
(45) Date of Patent: Oct. 27, 2009

(54) CROSSBAR CONTROL CIRCUIT

(76) Inventor: Blaise Laurent Mouttet, 4201 Wilson Blvd. #110-364, Arlington, VA (US) 22203

( * ) Notice: Subject to any disclaimer, the term of this patent is extended or adjusted under 35 U.S.C. 154(b) by 169 days.

(21) Appl. No.: 11/976,927

(22) Filed: Oct. 30, 2007

(65) Prior Publication Data

US 2008/0059688 A1    Mar. 6, 2008

Related U.S. Application Data

(63) Continuation-in-part of application No. 11/798,647, filed on May 16, 2007, which is a continuation-in-part of application No. 11/395,237, filed on Apr. 3, 2006, now Pat. No. 7,302,513.

(51) Int. Cl.
*H03K 19/173* (2006.01)
*H03K 19/177* (2006.01)

(52) U.S. Cl. ............... 326/38; 326/41; 326/47; 977/708; 977/940

(58) Field of Classification Search ............ 326/37–41, 326/47, 101; 977/708, 940; 716/16; 710/317
See application file for complete search history.

(56) References Cited

U.S. PATENT DOCUMENTS

| 5,272,359 | A | 12/1993 | Nagasubramanian et al. |
| 5,680,070 | A | 10/1997 | Anderson et al. |
| 6,128,214 | A | 10/2000 | Kuekes et al. |
| 6,531,371 | B2 | 3/2003 | Hsu et al. |
| 6,574,130 | B2 | 6/2003 | Segal et al. |
| 6,867,996 | B2 | 3/2005 | Campbell et al. |
| 7,274,208 | B2 * | 9/2007 | DeHon et al. ............ 326/38 |

OTHER PUBLICATIONS

Mouttet, Nanomaterials and Morphware, Nanotechnology Law & Business, Jun. 2007, pp. 149-156.

* cited by examiner

*Primary Examiner*—Daniel D Chang

(57) ABSTRACT

A control circuit includes a crossbar array having input columns and output rows configured to store first stored data in the form of high or low resistance states. The input columns are connected to a common electrical input and the output rows are connected to a common summing circuit. The crossbar control circuit may be implemented in a control system to provide for adjustment of the control system to changes in environmental conditions.

20 Claims, 3 Drawing Sheets

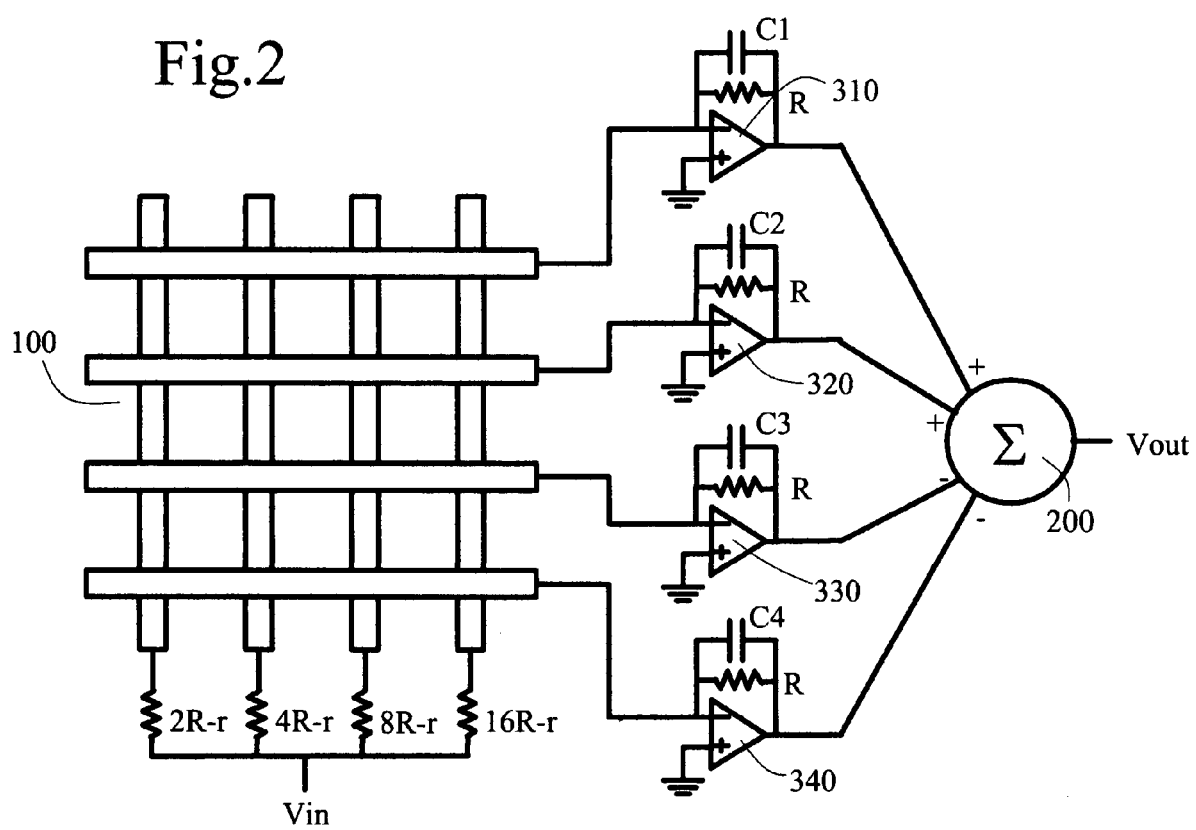

CROSSBAR CONTROL CIRCUIT

This patent application is a Continuation-In-Part of U.S. patent application Ser. No. 11/798,647, filed May 16, 2007, which is a Continuation-In-Part of U.S. patent application Ser. No. 11/395,237, filed Apr. 3, 2006, now U.S. Pat. No. 7,302,513.

FIELD OF THE INVENTION

The present invention pertains to a control circuit using a crossbar switching architecture suitable for applications in signal processing, morphware, and robotics.

BACKGROUND OF THE INVENTION

As disclosed in parent U.S. patent applications Ser. Nos. 11/798,647 and 11/395,237, which are incorporated by reference in their entirety, crossbar circuit architectures may be configured to provide for programmable signal processors. The present patent application provides further embodiments of such systems to provide adaptive control system applications.

BRIEF DESCRIPTION OF THE DRAWINGS

FIG. 2 illustrates a particular embodiment of a crossbar control circuit.

DETAILED DESCRIPTION

Figure 1:
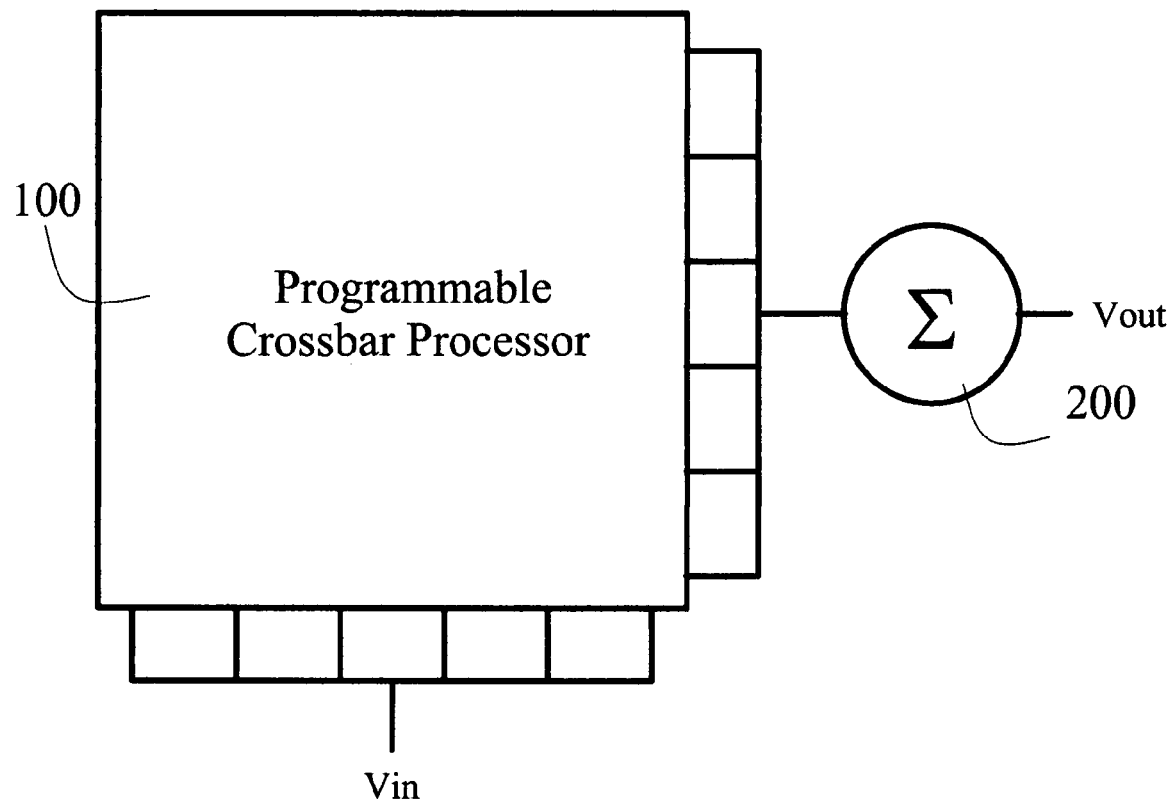
FIG. 1 illustrates a basic example of a crossbar control circuit.

FIG. 1 illustrates a programmable crossbar processor 100 as described in parent U.S. patent application Ser. No. 11/798,647 (FIG. 6) with the signal input paths connected to a common electrical input voltage $V_{in}$ and with the signal output paths connected to a common summing circuit 200. Crossbar arrays used in such programmable crossbar processors include intersecting arrays of wires in which the intersections (i.e. crosspoints) between the wires are set to a relatively high or low resistance state. Either a mechanical switch or a molecular or thin film material is included between the wires capable of switching between resistance states. Such crossbar arrays and associated resistance switching materials are described in prior art such as Nagasubramanian et al. U.S. Pat. No. 5,272,359, Kuekes et al. U.S. Pat. No. 6,128,214, Hsu et al. U.S. Pat. No. 6,531,371, Segal et al. U.S. Pat. No. 6,574,130, and Campbell U.S. Pat. No. 6,867,996 as well as U.S. patent application Ser. Nos. 11/395,237 and 11/395,232, each or which is incorporated by reference in their entirety. As discussed in the prior art, resistance switching materials include rotaxanes, TCNQ, chalcogenides, perovskites, and a variety of other materials, each of which is contemplated for embodiments of the present invention. Carbon nanotubes and carbon nanotube ribbons, as taught by Segal et al. U.S. Pat. No. 6,574,130 and other related patents assigned to Nantero, may also be used to form a crossbar array without the use of a thin film or molecular material. Either nanoscale wires (nanowires) or microscale wires may be used to form a crossbar array with nanoscale wires having the advantage of higher potential circuit densities and microscale wires having the advantage of ease of fabrication with reduced defects. In order to prevent feedback paths the input wires of the crossbar array may be doped with a p-type dopant and the output wires may be doped with n-type dopant or, alternatively, a rectification layer may be provided between the wire arrays forming the crossbar.

A crossbar array according to the present invention stores data in terms of high or low resistance states in the intersecting crosspoints. Low resistance states may be interpreted as a logic 1 (allowing current flow) while high resistance states may be interpreted as a logic 0 (limiting current flow). Various programming circuits and programming techniques exist for resistance crosspoint architectures such as disclosed in the parent applications and prior art such as Rinerson et al. U.S. Pat. No. 6,940,744 and Ovshinsky et al. U.S. Pat. No. 5,912,839.

FIG. 2 illustrates one particular embodiment of a crossbar array 100 in which the column wires are connected to input voltage signal $V_{in}$ via different input resistances having values of 2R-r, 4R-r, 8R-r, and 16R-r where r is equal to the average value of the low resistance states at the crosspoints. The output rows are connected to op-amps 310, 320, 330, and 340 with parallel RC feedback impedances in which the feedback resistance component R is equal to the resistance used in calculating the input resistances 2R-r, 4R-r, etc. The outputs are all connected to a summation circuit 200 configured to add or subtract the signals from the respective rows to produce output voltage signal $V_{out}$.

As taught in parent patent application Ser. No. 11/395,237, the general transfer function from a set of input signals $V_{in}(i)$ (i:column index) to a set of output signals $V_{out}(j)$ (j:row index) using a rectified crossbar with op-amps configured as summing amplifiers can be approximated (assuming a negligible voltage drop due to rectification or, alternatively, using a compensating voltage offset to counteract a non-negligible voltage drop) as:

$$V_{out}(j) = \Sigma T(i,j) \times V_{in}(i) \text{ the summation performed over } i \quad (Eq.1)$$

The values of T(i,j) (neglecting parasitic effects) can generally be approximated as:

$$T(i,j) = -Z_{out}(j)/[Z_{in}(i)+Z(i,j)] \quad (Eq.2)$$

wherein $Z_{out}(j)$ are the feedback impedances of the op-amps, $Z_{in}(i)$ are the input impedances to the columns, and $Z(i,j)$ are the crosspoint impedances. For the particular circuit configuration of FIG. 2 the feedback impedances expressed in the Laplace domain are:

$$Z_{out}(j) = R/[1+sRC(j)] \quad (Eq.3)$$

Given (Eq.1)-(Eq.3) the circuit configuration of FIG. 2 provides a transfer function which may be approximated in the Laplace domain as $$V_{out}/V_{in} = -b_1/[1+sRC_1] - b_2/[1+sRC_2]b_3/[1+sRC_3] + b_4/[1+sRC_4] \quad (Eq.4)$$

wherein coefficient values of $b_1$, $b_2$, $b_3$, and $b_4$ are determined by the combined resistance states of the crosspoints for a corresponding row (for example, if the first and third columns of the first row were set at a low resistance state and the second and fourth columns of the first row were set at a high resistance state, several orders of magnitude higher than the low resistance state, $b_1$ may be approximated by ½+⅛=0.625).

More generally, a variety of different crossbar sizes may be used in accordance with the present invention such as 2×2, 2×3, 3×2, 3×3, . . . , 100×100 crossbar arrays and greater. Increasing the number of columns can provide for a greater adjustment of the coefficient values $b_j$ while increasing the number of rows can provide for a larger range of transfer functions to be generated. While parallel RC circuits are used as the feedback impedance of the op-amps connected to the crossbar rows and particular input resistances are provided to the crossbar columns as illustrated in FIG. 2, other arrangements of individual resistances, individual capacitances, series RC circuits, or other circuit arrangements may be substituted and used in a variety of combinations to achieve a larger variety of possible transfer functions. In general, the circuit may be configured to produce a total transfer function based on the ratio of an output voltage ($V_{out}$) from the common summing circuit to an input voltage ($V_{in}$) to the common electrical input which can be approximated by:

$$V_{out}/V_{in} = \Sigma c_j b_j/(1+a_j s) \tag{Eq.5}$$

wherein j is a summation index according to the output rows of the crossbar array, the values of $b_j$ are determined by the resistance states of the crosspoints for a corresponding row, $c_j$=1 or −1 depend on the configuration of the common summing circuit for a corresponding row, and the values of $1/(1+a_j s)$ are transfer functions associated with a corresponding row.

Figure 3A:
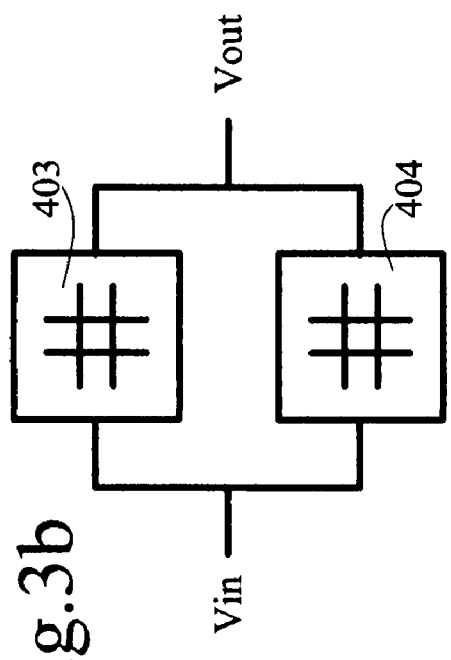
FIGS. 3a-3c illustrates crossbar control circuits combined in various configurations.
Figure 3B:
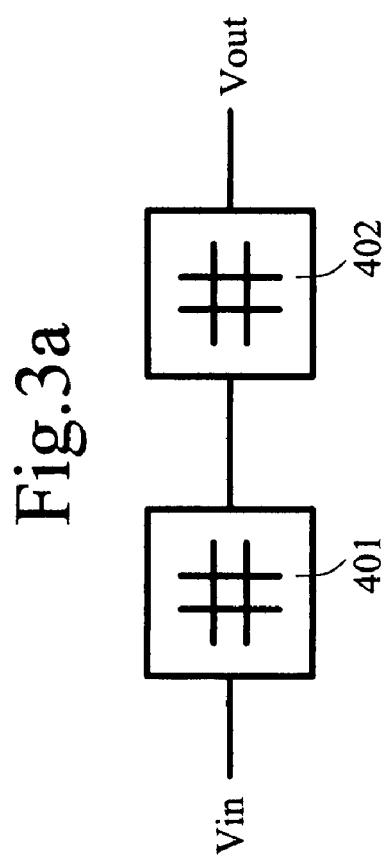
Figure 3C:
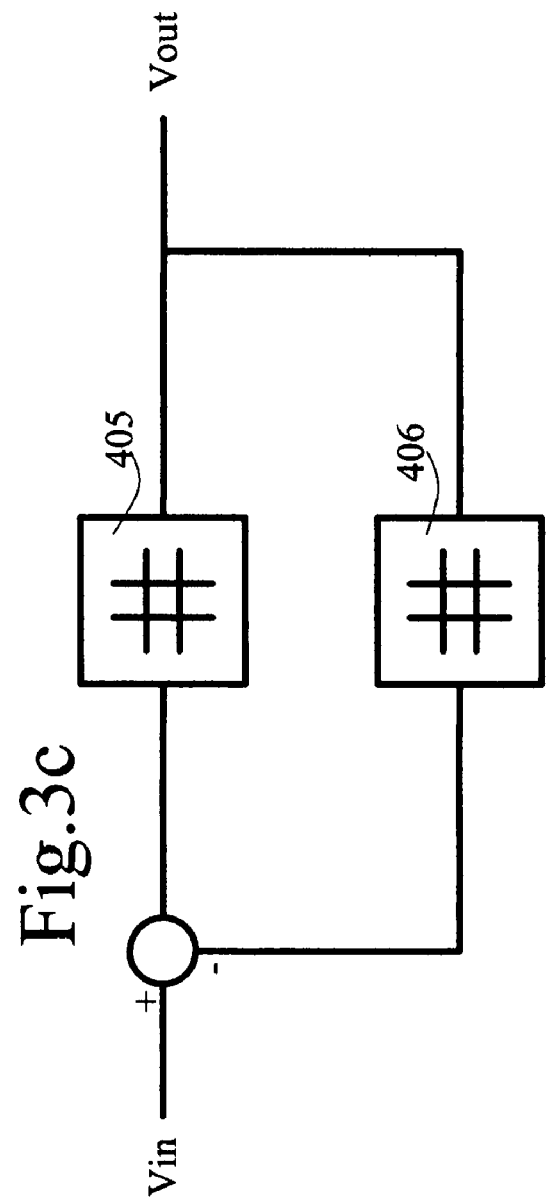

Various combinations of crossbar control circuits may be combined in series and parallel configurations to achieve a greater range of transfer functions for control systems. FIG. 3a illustrates a series arrangement of two crossbar control circuits 401, 402. FIG. 3b illustrates a parallel arrangement of two crossbar control circuits 403, 404. FIG. 3c illustrates a forward path crossbar control circuit 405 combined with a feedback path crossbar control circuit 406. The crossbar control circuits may also be combined with conventional (non-crossbar) control circuit elements to provide more adaptive control of conventional control circuitry.

Various methods of programming and reprogramming control circuits and systems using crossbars may be usefully employed. Periodic or repeated reprogramming of resistance states of crosspoints of the crossbar array in the control circuit may be performed followed by testing of a parameter related to a design criteria so as to automatically optimize a control circuit. For example, bandwidth, peak overshoot, rise time, settling time, steady-state error, or a variety of combinations of these parameters may be tested after each change in one of the resistance states. An improvement of the measured parameter or combination of parameters with respect to a predetermined desired state would be indicative of maintaining the changed resistance state. However, if the measured parameter generates a greater deviation from the predetermined desired state than the resistance state change may be reversed. In this fashion an "evolution" of the circuit design to match desired conditions can occur over numerous iterations. In the example of FIG. 2, initially a crosspoint resistance may be altered for the first row according to the column with the highest input resistance (16R-r) since this would in most cases produces the minimum impact on the total transfer function. If improvements are found by changing this crosspoint resistance, the next crosspoint resistance associated with the second highest input resistance (8R-r) may also be changed and so on. However, when the measured parameter or combination of parameters generate a greater deviation when compared to the predetermined desired state, the latest change in crosspoint resistance may be reversed for the first row and the process may be repeated with respect to the second row. This process can be continued for all 16 crosspoint resistances.

Alteration of the resistance states of a crossbar control circuits as described above may also be initiated by a change in an environmental condition, such as by detecting temperature, motion, sound, a change in weight, or detection of one or more chemicals. This is useful to optimize control circuits to particular environmental conditions. For example, under different temperature ranges resistance values will alter which can affect the desired performance of a control circuit. The crosspoint resistances may be adjusted to compensate for such temperature induced changes. In other cases a detection of motion, sound, or certain chemical compositions may require a certain signal processing task to be achieved in applications involving robotics, security systems, or safety systems. Crosspoint resistances to be programmed into crossbar control circuits according to different sensed ranges of temperature, sound, motion, or chemicals may be stored in a look-up table of a memory device. Of course, in addition to automatic reprogramming of the resistance states of crosspoints, manual reprogramming by a user may be performed.

As described above many modifications of the present invention are possible and many applications are possible. The present invention is only limited by the following claims.

I claim:

1. A control circuit including a crossbar array having input columns and output rows configured to store first stored data in the form of high or low resistance states wherein the input columns are connected to a common electrical input having an input voltage signal and the output rows are connected to a common summing circuit configured to sum signals from the rows to produce an output voltage signal, wherein the control circuit is configured to produce a transfer function based on the ratio of the output voltage signal to the input voltage signal which is determined by the resistance states of the crossbar array.

2. The control circuit of claim 1 wherein different resistances are connected between the common electrical input and each of the input columns.

3. The control circuit of claim 1 wherein each row of the crossbar array is connected to the summing circuit via an operational amplifier circuit with a parallel RC feedback path.

4. The control circuit of claim 1 wherein the crossbar array is a nanowire crossbar array.

5. The control circuit of claim 1 wherein the crossbar array is a carbon nanotube crossbar array.

6. The control circuit of claim 1 wherein the crossbar array includes TCNQ material as resistance variable material.

7. The control circuit of claim 1 wherein the crossbar array includes chalcogenide material as resistance variable material.

8. The control circuit of claim 1 wherein the crossbar array includes perovskite material as resistance variable material.

9. A first and second control circuit, each of the control circuits as described in claim 1, wherein the control circuits are connected in series.

10. A first and second control circuit, each of the control circuits as described in claim 1, wherein the control circuits are connected in parallel.

11. A control system including a first and second control circuit, each of the control circuits as described in claim 1, wherein one of the control circuits is in a feed forward path and one of the control circuits is in a feedback path.

12. A control circuit including a crossbar array having input columns and output rows configured to store first stored data in the form of high or low resistance states wherein the input columns are connected to a common electrical input having an input voltage ($V_{in}$) and the output rows are connected to a common summing circuit wherein the circuit is configured to produce a total transfer function based on the ratio of an output voltage ($V_{out}$) from the common summing circuit to an input voltage ($V_{in}$) to the common electrical input which can be approximated by:

$$V_{out}/V_{in} = \Sigma c_j b_j/(1+a_j s)$$

wherein j is a summation index according to the output rows of the crossbar array, the values of $b_j$ are determined by the resistance states of the crosspoints for a corresponding row, $c_j=1$ or $-1$ depend on the configuration of the common summing circuit for a corresponding row, and the values of $1/(1+a_j s)$ are transfer functions in the Laplace domain associated with a corresponding row.

13. A method including the steps of:

providing a control circuit including a crossbar array having input columns and output rows configured to store first stored data in the form of high or low resistance states wherein the input columns are connected to a common electrical input having an input voltage signal and the output rows are connected to a common summing circuit configured to sum signals from the rows to produce an output voltage signal, wherein the control circuit is configured to produce a transfer function based on the ratio of the output voltage to the input voltage which is determined by the resistance states of the crossbar array; and reprogramming resistance states of the crossbar array.

14. The method of claim 13 wherein the reprogramming of the resistance states of the crossbar array is based on a change in an environmental condition.

15. The method of claim 14 wherein the change in an environmental condition is a temperature change.

16. The method of claim 14 wherein the change in an environmental condition is based on a detection of motion.

17. The method of claim 14 wherein the change in an environmental condition is based on a detection of sound.

18. The method of claim 14 wherein the change in an environmental condition is based on a detection of one or more chemicals.

19. The method of claim 13 wherein the reprogramming is performed manually by a user.

20. The method of claim 13 wherein the reprogramming is performed automatically.

\* \* \* \* \*